(12) United States Patent
Kariya et al.

(10) Patent No.: US 7,731,504 B2
(45) Date of Patent: *Jun. 8, 2010

(54) PRINTED BOARD WITH COMPONENT MOUNTING PIN

(75) Inventors: Takashi Kariya, Ogaki (JP); Toshiki Furutani, Ogaki (JP); Takeshi Kawanishi, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 119 days.

This patent is subject to a terminal disclaimer.

(21) Appl. No.: 12/254,592

(22) Filed: Oct. 20, 2008

(65) Prior Publication Data

US 2009/0053910 A1    Feb. 26, 2009

Related U.S. Application Data

(62) Division of application No. 11/566,862, filed on Dec. 5, 2006, now Pat. No. 7,497,694.

(30) Foreign Application Priority Data

Dec. 9, 2005    (JP)    ............... 2005-356168

(51) Int. Cl.
*H01R 9/00* (2006.01)
(52) U.S. Cl. .............. 439/66; 439/81; 439/80; 439/83
(58) Field of Classification Search .......... 439/66, 439/81, 80, 83
See application file for complete search history.

(56) References Cited

U.S. PATENT DOCUMENTS

| 4,828,346 | A | 5/1989 | Jacobsen et al. |
| 5,491,301 | A | 2/1996 | Akiba et al. |
| 5,495,667 | A | 3/1996 | Farnworth et al. ............ 29/843 |
| 5,635,750 | A | 6/1997 | Schlaak et al. |
| 5,719,448 | A | 2/1998 | Ichikawa ................ 257/781 |
| 6,049,976 | A | 4/2000 | Khandros |
| 6,229,683 | B1 | 5/2001 | Goodwin-Johansson |
| 6,290,510 | B1 | 9/2001 | Fork et al. |

(Continued)

FOREIGN PATENT DOCUMENTS

JP     7-7263     1/1995

(Continued)

OTHER PUBLICATIONS

Kiyoshi Takagi, "Build-Up Multilayer Printed Wiring Board Technologies", Nikkan kougyou shinbunsya, Jun. 20, 2000, pp. 67-73, 75-83, two cover pages and two end pages (with Partial English Translation).

*Primary Examiner*—Gary F. Paumen
(74) *Attorney, Agent, or Firm*—Oblon, Spivak, McClelland, Maier & Neustadt, L.L.P.

(57) ABSTRACT

A printed circuit board according to the present invention is a printed circuit board (4) including a component mounting pin (1) made of a metal wire to connect with a semiconductor chip (10). The semiconductor chip (10) is a surface mounting type semiconductor chip having an electrode pad on its mounting surface for use in a flip-chip mounting system. The component mounting pin (1) is formed by using wire-bonding technology. This printed circuit board (4) is able to decrease malconnections or disconnection caused by a difference between the coefficients of thermal expansion of the semiconductor chip (10) and the printed circuit board (4).

20 Claims, 4 Drawing Sheets

U.S. PATENT DOCUMENTS

| | | | |
|---|---|---|---|
| 6,324,067 | B1 | 11/2001 | Nishiyama |
| 6,778,406 | B2 | 8/2004 | Eldridge et al. |
| 7,230,440 | B2 | 6/2007 | Hantschel et al. |
| 7,530,814 | B2 * | 5/2009 | Ramaswamy et al. ......... 439/66 |
| 7,553,165 | B2 * | 6/2009 | Mathieu et al. .............. 439/66 |
| 2002/0164893 | A1 | 11/2002 | Mathieu et al. |
| 2002/0192364 | A1 | 12/2002 | Kanoh et al. |
| 2003/0030965 | A1 | 2/2003 | Chua et al. |
| 2003/0121698 | A1 | 7/2003 | Kyougoku et al. |
| 2003/0132027 | A1 | 7/2003 | Maruyama et al. .......... 174/267 |
| 2005/0130462 | A1 | 6/2005 | Van Schuylenbergh et al. |
| 2005/0155706 | A1 | 7/2005 | Nishida et al. .............. 156/312 |
| 2006/0040417 | A1 | 2/2006 | Eldridge et al. .............. 438/14 |
| 2006/0088705 | A1 | 4/2006 | Mitsumori |
| 2006/0139145 | A1 | 6/2006 | Ono ........................... 338/315 |
| 2006/0220234 | A1 | 10/2006 | Honer et al. ................ 257/724 |
| 2007/0187140 | A1 | 8/2007 | Kariya et al. |
| 2007/0256297 | A1 | 11/2007 | Kariya et al. |

FOREIGN PATENT DOCUMENTS

| | | |
|---|---|---|
| JP | 7-326619 | 12/1995 |
| JP | 11-506829 | 6/1999 |
| JP | 2000-512437 | 9/2000 |
| JP | 2000-357762 | 12/2000 |
| JP | 2001-502851 | 2/2001 |
| JP | 2003-198068 | 7/2003 |
| JP | 2004-40138 | 2/2004 |
| JP | 2004-311919 | 11/2004 |
| JP | 2005-183466 | 7/2005 |
| KR | 1999-022385 | 3/1999 |
| KR | 2001-0012575 | 2/2001 |
| WO | WO 96/41506 | 12/1996 |
| WO | WO 98/50953 | 11/1998 |
| WO | WO 98/52224 | 11/1998 |
| WO | WO 99/18445 | 4/1999 |
| WO | WO 2007/066563 A1 | 6/2007 |
| WO | WO 2007/066564 A1 | 6/2007 |

* cited by examiner

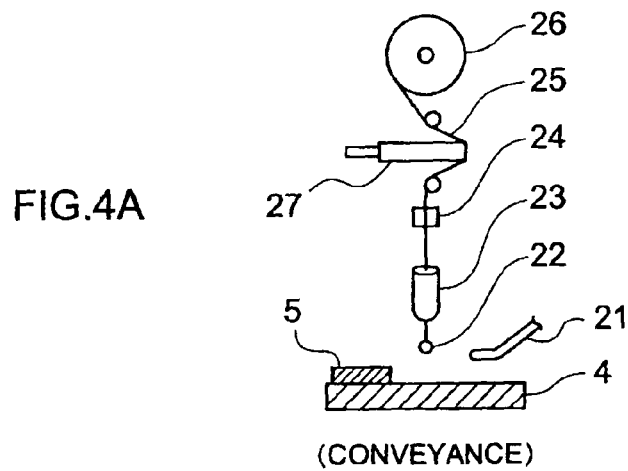
FIG.4A (CONVEYANCE)
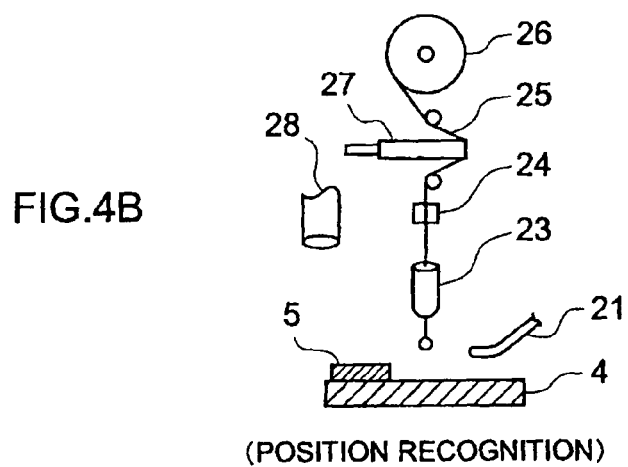
FIG.4B (POSITION RECOGNITION)
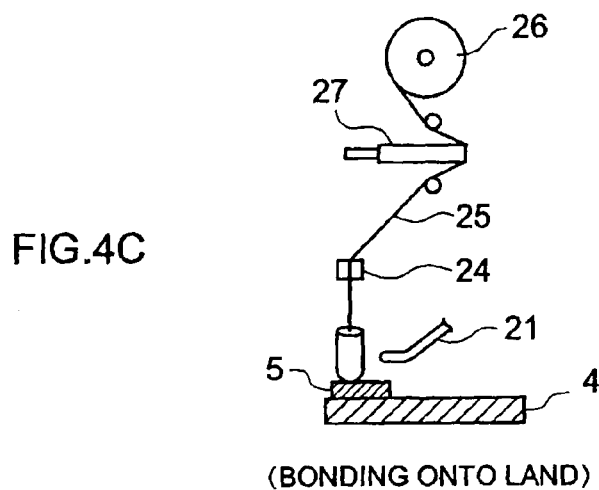
FIG.4C (BONDING ONTO LAND)

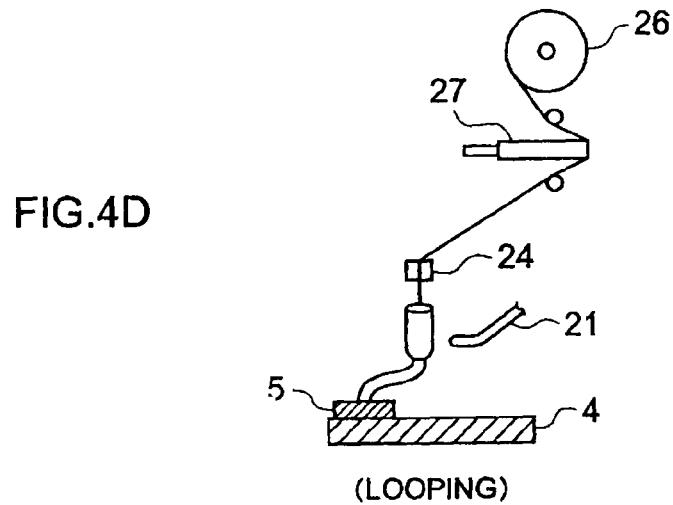
FIG.4D (LOOPING)
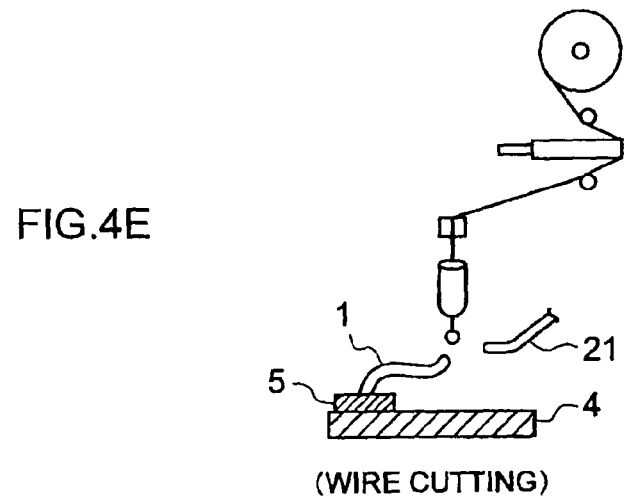
FIG.4E (WIRE CUTTING)
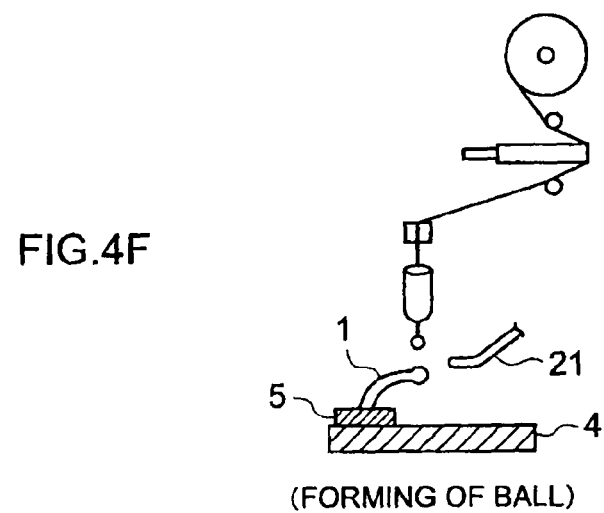
FIG.4F (FORMING OF BALL)

PRINTED BOARD WITH COMPONENT MOUNTING PIN

CROSS-REFERENCE TO RELATED APPLICATIONS

This application is a divisional of and claims the benefit of U.S. application Ser. No. 11/566,862, filed Dec. 5, 2006, which claims priority of Japanese Patent Application No. 2005-356168, filed on Dec. 9, 2005. The entire content of each of these applications is incorporated herein by reference to the extent that such incorporation does not create an issue of new matter.

BACKGROUND OF THE INVENTION

1. Field of the Invention

The present invention relates generally to printed circuit boards, and more particularly to a printed circuit board with a conductive component mounting pin.

2. Description of the Related Art

[Patent Document 1]: Japanese Patent Laid-Open Publication No. 2005-183466 "Multilayer Printed Circuit Board" (published on Jul. 7, 2005)

The Background Art of the Patent Document 1 has described a flip-chip mounting system printed circuit board using suitable technology such as solder bump in which a solder resist layer 70 is formed on an upper layer of a via hole 160 and a conductor circuit 158, bumps 76U and 76D being formed on the via hole 160 and the conductor circuit 158 through an opening portion 71 of the solder resist layer 70. An IC (integrated circuit, not shown) chip may be electrically connected to the printed circuit board by C4 (flip-chip) mounting.

However, the above Patent Document 1 fails to mention a printed circuit board with a component mounting pin disclosed in the present invention.

SUMMARY OF THE INVENTION

On the other hand, as an integration degree of semiconductor apparatus is increasing more in recent years, a chip size thereof also is becoming enormous. If an electronic device in the mounting state in which an electrode pad of an electronic component (e.g. semiconductor chip) of a gigantic size and a land of a printed circuit board are soldered is exposed to rise and fall of an ambient temperature, then it is unavoidable that a soldered portion will be broken due to a difference between coefficients of thermal expansion of the electronic component and the printed circuit board.

Therefore, a demand of developing a printed circuit board in which malconnections or disconnections caused by a difference between the coefficients of thermal expansion of the electronic component and the printed circuit board can be decreased even when a highly-integrated semiconductor chip is mounted thereon has increased so far.

In view of the aforesaid aspects, an object of the present invention is to provide a printed circuit board in which malconnections or disconnections caused by a difference between the coefficients of thermal expansion of an electronic component and a printed circuit board can be decreased even when a highly-integrated electronic component (e.g. semiconductor chip) is mounted thereon.

A printed circuit board of the present invention includes a component mounting pin made of a conductive material to connect with an electronic component.

Further, in the printed circuit board, said component mounting pin may be formed of a metal wire.

Further, in the printed circuit board, said electronic component may be a surface mounting type semiconductor chip having an electrode pad on its mounting surface for use in a flip-chip mounting system.

Further, in the printed circuit board, said component mounting pin is made of a material with suitable properties such as flexibility, elasticity and pliability.

Further, in the printed circuit board, said component mounting pin may be made of a material with low electric resistance.

Further, in the printed circuit board, said component mounting pin may be formed by wire bonding technology.

Further, in the printed circuit board, said component mounting pin may be formed as a pin of any shape selected from a group of pin shapes of a vertical S-like pin, a horizontal S-like pin, a curved pin, a loop-like pin, a spiral pin, a spring-like pin, a circular pin and an elliptic pin.

Further, in the printed circuit board, said component mounting pin may be coated with a protective coating.

Further, an electronic device comprising:

a printed circuit board with a component mounting pin; and an electronic component, wherein said component mounting pin is urged against an electrode pad of said electronic component.

Further, an electronic device of the present invention comprises: a printed circuit board with a component mounting pin; and an electronic component, wherein said component mounting pin is connected to an electrode pad of said electronic component by solder-joint through a solder bump.

Further, in the an electronic device, said component mounting pin may be a mechanical element capable of absorbing mechanical energy applied to either of or both of a semiconductor apparatus and a printed circuit board through elasticity or deformation.

Further, in the electronic device, said printed circuit board may be fixed to a case of said electronic device.

Further, in the an electronic device, said printed circuit board and said electronic component may be fixed to each other by adhesive.

Further, a method of manufacturing a printed circuit board with a component mounting pin of the present invention comprises the steps of: (a) a step for conveying a metal wire onto an electrode land of a printed circuit board attached to a suitable positioning apparatus; (b) a step for recognizing a land bonding point of said printed circuit board; (c) a step for compression-bonding and joining a tip end of a metal wire to said land bonding point; (d) a step for looping said metal wire; (e) a step for cutting said metal wire; (f) a step for forming a ball by fusing a tip end portion of said cut metal wire; and (g) a step for moving a metal wire to the next land of said printed circuit board.

Further, in the method of manufacturing a printed circuit with a component mounting pin, said steps (a) to (g) may be executed repeatedly.

Further, in the method of manufacturing a printed circuit with a component mounting pin, said step (c) may be executed by using thermocompression bonding system and ultrasonic waves at the same time.

According to the present invention, a printed circuit board may be provided in which malconnections or disconnections caused by a difference between the coefficients of thermal expansion of an electronic component and a printed circuit board can be decreased even when a highly-integrated electronic component is mounted thereon.

BRIEF DESCRIPTION OF THE DRAWINGS

FIGS. 4A to 4F are respectively diagrams showing respective steps of a method of manufacturing a printed circuit board with a component mounting pin.

EXPLANATION OF REFERENCE NUMERALS

Figure 1:
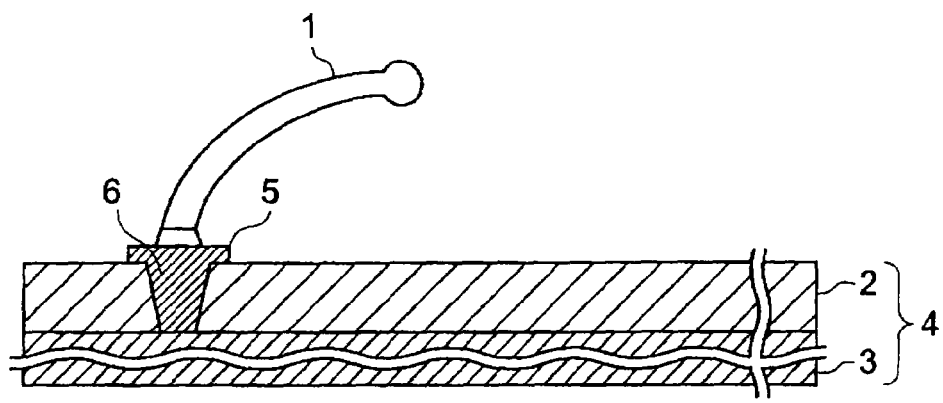
FIG. 1 is a diagram showing part of an arrangement of a printed circuit board with a component mounting pin.

1: component mounting pin, 2: insulating layer, 4: printed circuit board, 5: land, electrode land, 6: filled via, 10: semiconductor via, 11: pad, electrode pad, 12: solder bump, 21: electric torch, 22: ball, 23: capillary, 24: clamper, 25: metal wire, 26: spool, 27: air tension, 28: position detecting camera

DESCRIPTION OF THE PREFERRED EMBODIMENTS

A printed circuit board with a component mounting pin according to the embodiments of the present invention will be described below in detail with reference to the drawings. In the following drawings, identical elements and parts are denoted by identical reference numerals and therefore need not be described.

[Printed Circuit Board with Component Mounting Pin]

FIG. 1 of the accompanying drawings is a diagram showing part of an arrangement of a printed circuit board with a component mounting pin. As shown in FIG. 1, a printed circuit board 4 includes a conductive component mounting pin 1 to connect with an electronic component, e.g. a semiconductor chip (not shown). This component mounting pin 1 can be formed by using wire bonding technology, for example.

The printed circuit board with the component mounting pin according to the embodiment of the present invention is characterized in that a component mounting pin is formed on an electrode land of a printed circuit board in advance, the component mounting pin being electrically connected to the electrode pad of a semiconductor chip in a surface mounting fashion (i.e. two-dimensional mounting: mounting in which a joint member in flip-chip mounting system is changed from solder to pin).

The printed circuit board 4 with the component mounting pin 1 is characterized by the conductive component mounting pin 1 electrically connected to an electrode land (outermost layer conductor) 5. Alternatively, the electrode land 5 may be formed on a filled via-hole 6. A rest of arrangement of the printed circuit board 4 can be changed freely. Since the embodiment of the present invention is characterized by the outermost layer conductor, the printed circuit board 4 is composed of an insulating layer 2 on which the outermost layer conductor 5 is formed and other layer 3 formed of a predetermined insulating layer and a conductor layer and hence the insulating layer 2 and other layer 3 will be explained separately in order to understand the present invention more clearly. It should be noted that a desired solder resist layer may be formed on the upper surface of the insulating layer 2.

One end of the component mounting pin 1 is connected electrically to the electrode land 5 and the other end thereof is erected from the printed circuit board 4. The component mounting pin 1 may be coated with a desired conductive protecting coating (not shown). The printed circuit board 4 is connected to a semiconductor apparatus (not shown) through this component mounting pin 1.

The component mounting pin 1 is made of a material having suitable properties such as flexibility, elasticity and pliability and the like. Preferably, the component mounting pin 1 should be made of a material with low electric resistance in addition to flexibility, elasticity and pliability. Typically, the component mounting pin 1 may be formed of a metal wire.

Figure 2A:
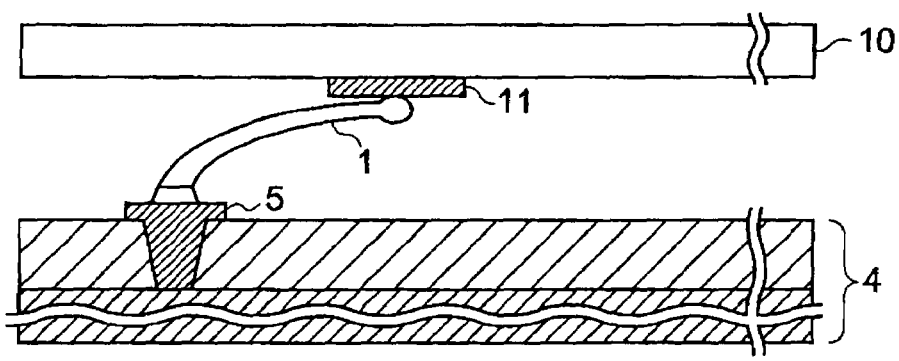
FIG. 2A is a diagram showing a method of mounting an electronic device in which a component mounting pin of a printed circuit board is urged against an electrode pad of a semiconductor chip.
Figure 2B:
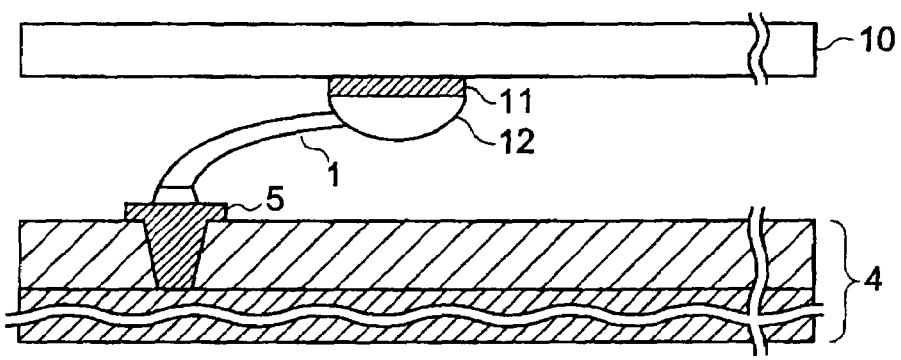
FIG. 2B is a diagram showing a method of mounting an electronic device in which a component mounting pin of a printed circuit board is connected to an electrode pad of a semiconductor chip by solder-joint through solder bump.

FIGS. 2A and 2B are respectively diagrams showing methods of mounting electronic devices including the printed circuit board 4 with the component mounting pin 1 and a semiconductor chip 10. The former electronic device shown in FIG. 2A and the latter electronic device shown in FIG. 2B are different from each other in that while the component mounting pin 1 is urged against an electrode pad 11 of the semiconductor chip 10 as shown in FIG. 2A, the component mounting pin 1 is solder-connected to the electrode pad 11 of the semiconductor chip 10 by using a pin solder bump 12 as shown in FIG. 2B.

In the electronic device shown in FIG. 2A, the component mounting pin 1 of the printed circuit board 4 electrically contacts with the electrode pad 11 formed on the semiconductor chip 10 to maintain electric connection. The printed circuit board 4 and the semiconductor chip 10 may be fixed to each other by any method. For example, both of the printed circuit board 4 and the semiconductor chip 10 may be fixed to a case of an electronic device, although not shown. Alternatively, the printed circuit board 4 and the semiconductor chip 10 may both be fixed to each other by using adhesive such as resin.

The mounting structure shown in FIG. 2A is characterized in that the member lying between the semiconductor device 10 and the printed circuit board 4 to connect them is varied from the related-art solder bump to the component mounting pin 1. Since the component mounting pin 1 is made of the material with suitable properties such as flexibility, elasticity and pliability, it can ensure electric connection between the semiconductor device 10 and the printed circuit board 4 when being pressed against the electrode pad 11. Further, it is to be understood that the component mounting pin 1 might be a mechanical element to absorb force (mechanical energy) applied to either of or both of the semiconductor device 10 and the printed circuit board 4 by elasticity or deformation. Hence, the component mounting pin 1 is able to decrease malconnections or disconnections caused by a difference between the coefficients of thermal expansion of the semiconductor device 10 and the printed circuit board 4.

Further, since the component mounting pin 1 is very short in length, there can be obtained excellent electric characteristics from a standpoint of matching of a characteristic impedance $Z_0$ and also from a standpoint of increasing a propagation speed of an electric signal. Similarly, when the component mounting pin 1 is formed of a material with low electric resistance, it is possible to avoid useless voltage drop. For example, a component mounting pin might be made of Cu (copper), Au (gold), Ag (silver) or alloy of them. Alternatively, a component mounting pin might be a component mounting pin which is surface-finished by these metals.

Further, since the component mounting pin 1 is erected at its other end from the printed circuit board 4 as described above, it can be enclosed with the air to thereby increase a speed at which a signal is transmitted. Furthermore, when the component mounting pin 1 mechanically contacts with the electrode pad 10 of the semiconductor chip 10 by force of repulsion, it is possible to maintain satisfactory electric connection between the semiconductor chip 10 and the printed circuit board 4.

Furthermore, the printed circuit board 4 with the component mounting pin 1 according to the embodiment of the present invention is characterized by the component mounting pin 1 in electric contact with the electrode land 5 and a rest of the printed circuit board 4 can be changed freely. Hence, the present invention can be applied to other suitable circuit boards such as a large printed wiring board and a coreless printed circuit board that tends to warp. Further, since the semiconductor chip 10 and the printed circuit board 4 are connected together not by soldering but by mechanical contact of the component mounting pin 1, the embodiment of the present invention has a merit that a thermal budget during a reflow process ant others will not be left.

FIG. 2B is a diagram showing a mounting structure in which electric connection can be maintained by connecting the component mounting pin 1 of the printed circuit board 4 and the semiconductor chip 10 via soldering. As shown in FIG. 2B, a desired solder bump 12 may be provided at the tip end of the component mounting pin 1 of the printed circuit board 4 and in the state in which the component mounting pin 1 is brought in electric contact with the semiconductor chip 10, the component mounting pin 1 and the electrode pad 11 of the semiconductor chip 10 may be connected by soldering through solder reflow technology. Furthermore, if requested, the printed circuit board 4 and the semiconductor chip 10 might be fixed to each other by the above-mentioned methods.

FIGS. 3A to 3F are respectively diagrams to which reference will be made in explaining various shapes available for the component mounting pin 1. The component mounting pin 1 is made of the material with suitable properties such as flexibility, elasticity and pliability and it is urged against the electrode pad 11 of the semiconductor chip 10 as shown in FIG. 2A. In order to realize this mounting structure, the following shapes are available for the component mounting pin 1.

Figure 3A:
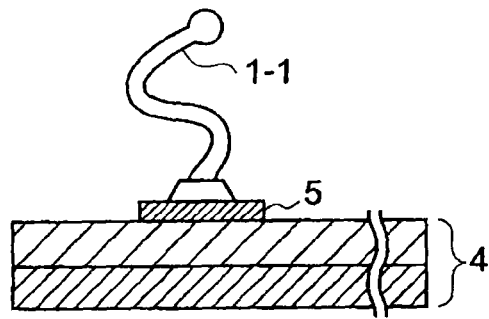
FIGS. 3A to 3F are respectively diagrams to which reference will be made in explaining various shapes available for the component mounting pin of the printed circuit board.
Figure 3B:
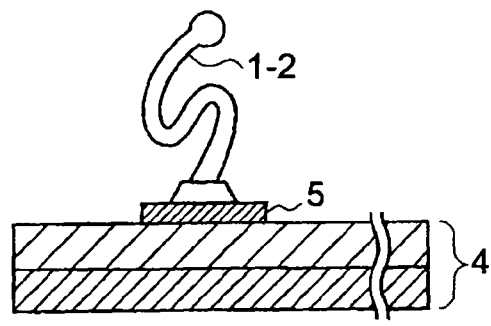
Figure 3C:
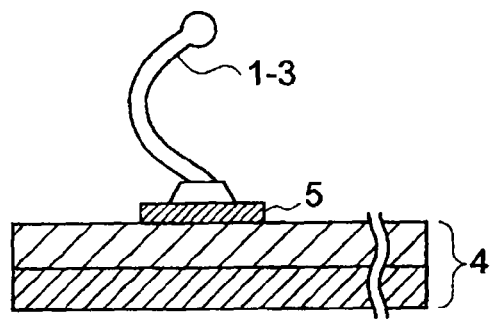
Figure 3D:
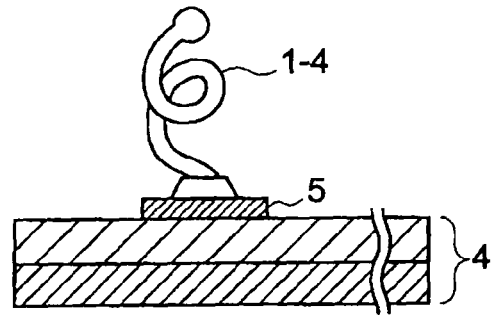
Figure 3E:
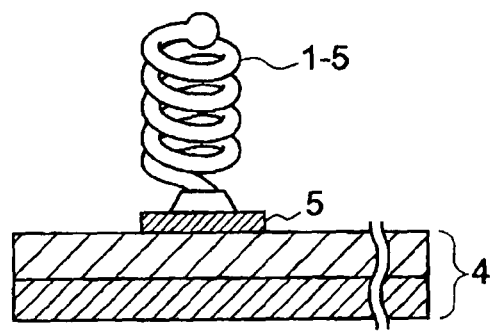
Figure 3F:
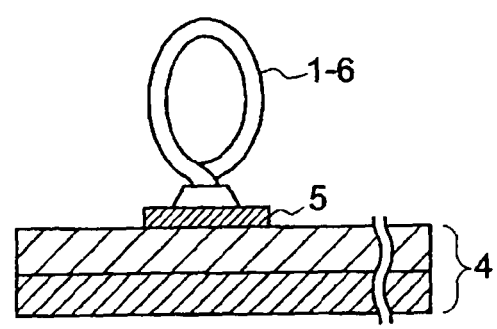

FIG. 3A shows a component mounting pin 1-1 which is shaped as a vertical S-like pin. FIG. 3B shows a component mounting pin 1-2 which is shaped as a horizontal S-like pin. FIG. 3C shows a component mounting pin 1-3 which is shaped like a curved pin. FIG. 3D shows a component mounting pin 1-4 which is shaped as a loop-like pin. FIG. 3E shows a component mounting pin 1-5 which is shaped as a spiral or spring-like pin. FIG. 3F shows a component mounting pin 1-6 which is shaped as a circular or elliptic pin. These shapes of the component mounting pin 1 are illustrated by way of example and any shape of the component mounting pin 1 can be used insofar as the component mounting pin 1 can be urged against the electrode pad 11 of the semiconductor chip 10.

[Method of Manufacturing Printed Circuit Board with Component Mounting Pin]

A method of manufacturing a printed circuit board with a component mounting pin will be now be described with reference to FIGS. 4A to 4D in comparison with related-art wire bonding technology.

First, the related-art wire bonding technology, e.g. nail-head bonding includes the following steps of a step (1) for conveying a lead frame on which a semiconductor chip is mounted, a step (2) for recognizing the position of a bonding pad of the semiconductor chip by a pattern recognition mechanism, a step (3) for executing bonding on the semiconductor chip side, a step (4) for looping (shaping) of a metal wire, a step (5) for bonding the semiconductor chip on the printed circuit board at its electrode land of the semiconductor chip adjacent area, a step (6) for cutting the metal wire, a step (7) for fusing the tip end of the thus cut metal wire to form a ball and a step (8) for moving the metal wire to the next semiconductor chip.

In the method of manufacturing the printed circuit board 4 with the component mounting pin 1 according to the embodiment of the present invention, the above-described steps of the step (1) of "conveyance", the step (2) of "position recognition", the step (5) of "bonding onto the land of the printed circuit board", the step (4) of "looping (shaping) of the metal wire", the step (6) of "cutting of the metal wire", the step of (7) "forming of the ball" and the step of (8) "moving of the metal wire" are executed, in that order.

In this case, it is to be assumed that the printed circuit board 4 in which the electrode land 5 is formed on the component mounting surface has already been fabricated. The following steps are executed by the use of this printed circuit board 4.

(a) Conveyance (See FIG. 4A):

The printed circuit board 4 is attached to a suitable positioning apparatus (not shown). As shown in FIG. 4A, a metal wire 25 is supplied from a spool 26 through holes of an air tension 27, a damper 24 and a capillary 23 to the electrode land 5 of the printed circuit board 4. A tip end of the metal wire 25 is shaped like a ball 22.

(b) Position Recognition (See FIG. 4B):

The position of the electrode 5 of the printed circuit board 4 is measured by a bonder position recognition mechanism using a position detecting camera 28 and a bonding point of the electrode land 5 is calculated.

(c) Bonding onto the Electrode Land of the Printed Circuit Board (See FIG. 4C):

The ball 22 of the metal wire 25 is urged against the bonding point of the electrode land 5 by the capillary 23 and the ball 22 is joined to the electrode land 5 of the printed circuit board 4 by diffusion of metal. In this case, in order to decrease damages caused on the printed circuit board 4 by heat, it is preferable that the step (c) should be executed by using thermocompression bonding system and ultrasonic waves together.

(d) Looping (Shaping) of Metal Wire (See FIG. 4D):

The metal wire 25 is shaped while elevating the capillary 23. The metal wire 25 should be reversed right and left and up and down in order to provide a metal wire of a desired shape.

(e) Cutting of Metal Wire (See FIG. 4E):

The metal wire 25 is cut by the damper 24 when the capillary 23 is elevated.

(f) Forming of Ball (See FIG. 4F):

An electric torch 21 applies discharged electricity to the tip end portion of the thus cut metal wire 25 to fuse the tip end of the metal wire 25 to thereby form a ball. At this stage, the metal wire 25 may become available as the component mounting pin 1.

(g) Movement (Not Shown):

A metal wire is moved onto an electrode land 5 of the next printed circuit board 4.

It is possible to manufacture a printed circuit board with a component mounting pin by repeatedly executing the above-described steps (a) to (g) at a high speed. It should be noted that the step (f) can be canceled.

[The Others]

While the embodiments of the printed circuit board with the component mounting pin according to the present invention have been described so far, it is needless to say that the present invention is not limited to those embodiments.

It should be understood by those skilled in the art that various modifications, combinations, sub-combinations and alterations may occur depending on design requirements and other factors insofar as they are within the scope of the appended claims or the equivalents thereof.

What is claimed is:

1. A printed circuit board comprising:
   an insulating layer;
   an outermost conductor layer having an electrode land, the outermost conductor layer being formed on the insulating layer; and
   a component mounting pin extending from the electrode land, wherein the component mounting pin is made of a conductive material having a property of at least one of flexibility, elasticity or pliability such that the component mounting pin is configured to be urged against an electrode pad of an electronic component by mechanical force of repulsion and not be soldering so as to electrically connect the printed circuit board to the electronic component by way of the component mounting pin.

2. A printed circuit board according to claim 1, wherein said component mounting pin is formed of a metal wire.

3. A printed circuit board according to claim 1, wherein said electric component is a surface mounting type semiconductor chip having the electrode pad on its mounting surface.

4. A printed circuit board according to claim 1, wherein said component mounting pin is made of a material with low electric resistance.

5. A printed circuit board according to claim 1, wherein said component mounting pin is formed by wire bonding technology.

6. A printed circuit board according to claim 1, wherein said component mounting pin is formed as a pin of any shape selected from a group of pin shapes of a vertical S-like pin, a horizontal S-like pin, a curved pin, a loop-like pin, a spiral pin, a spring-like pin, a circular pin and an elliptic pin.

7. A printed circuit board according to claim 1, wherein said component mounting pin is coated with a protective coating.

8. A printed circuit board according to claim 1, wherein said component mounting pin is a mechanical element capable of absorbing mechanical energy applied to either of or both of said electronic component and said printed circuit board through elasticity or deformation.

9. A printed circuit board according to claim 1, wherein said printed circuit board is fixed to a case of an electronic device including said printed circuit board and said electronic component.

10. A printed circuit board according to claim 1, wherein said printed circuit board and said electronic component are fixed to each other by adhesive.

11. A printed circuit board comprising:
    an insulating layer;
    an outermost conductor layer having an electrode land, the outermost conductor layer being formed on a surface of the insulating layer; and
    a component mounting pin extending from the electrode land, wherein the component mounting pin is made of a conductive material having a property of at least one of flexibility, elasticity or pliability such that the component mounting pin is configured to be connected to an electrode pad of a semiconductor chip of an electronic component through a solder bump such that a surface of the semiconductor chip having the electrode pad thereon opposes the surface of the insulating layer having the electrode land thereon.

12. A printed circuit board according to claim 11, wherein said component mounting pin is formed of a metal wire.

13. A printed circuit board according to claim 11, wherein said electric component is a surface mounting type semiconductor chip having the electrode pad on its mounting surface.

14. A printed circuit board according to claim 11, wherein said component mounting pin is made of a material with low electric resistance.

15. A printed circuit board according to claim 11, wherein said component mounting pin is formed by wire bonding technology.

16. A printed circuit board according to claim 11, wherein said component mounting pin is formed as a pin of any shape selected from a group of pin shapes of a vertical S-like pin, a horizontal S-like pin, a curved pin, a loop-like pin, a spiral pin, a spring-like pin, a circular pin and an elliptic pin.

17. A printed circuit board according to claim 11, wherein said component mounting pin is coated with a protective coating.

18. A printed circuit board according to claim 11, wherein said component mounting pin is a mechanical element capable of absorbing mechanical energy applied to either of or both of said electronic component and said printed circuit board through elasticity or deformation.

19. A printed circuit board according to claim 11, wherein said printed circuit board is fixed to a case of an electronic device including said printed circuit board and said electronic component.

20. A printed circuit board according to claim 11, wherein said printed circuit board and said electronic component are fixed to each other by adhesive.

* * * * *